United States Patent
Richardson et al.

(10) Patent No.: US 6,232,644 B1
(45) Date of Patent: May 15, 2001

(54) OXIDE PROFILE MODIFICATION BY REACTANT SHUNTING

(75) Inventors: William F. Richardson, Richardson; Yin Hu, Plano, both of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/389,006

(22) Filed: Sep. 2, 1999

Related U.S. Application Data

(62) Division of application No. 08/942,058, filed on Oct. 1, 1997.

(51) Int. Cl.$^7$ .................................................. H01L 29/00
(52) U.S. Cl. .......................... 257/506; 257/501; 438/297; 438/410; 438/439
(58) Field of Search ................................... 257/506, 501; 438/225, 297, 410, 439, 770, 775

(56) References Cited

U.S. PATENT DOCUMENTS

| | | | |
|---|---|---|---|
| 4,868,136 | * | 9/1989 | Ravaglia ................................ 437/38 |
| 4,927,780 | * | 5/1990 | Roth et al. ............................. 437/69 |
| 5,538,916 | | 7/1996 | Kuroi et al. .......................... 438/448 |
| 5,612,249 | * | 3/1997 | Sun et al. .............................. 437/69 |
| 5,629,230 | | 5/1997 | Fazan et al. .......................... 438/448 |
| 5,830,798 | * | 11/1998 | Dennison et al. ................... 438/297 |
| 5,913,136 | * | 6/1999 | Delconibus .......................... 438/586 |
| 5,930,649 | * | 7/1999 | Park ..................................... 438/444 |

FOREIGN PATENT DOCUMENTS

404275428 * 10/1992 (JP) ........................................ 21/316

* cited by examiner

*Primary Examiner*—Steven H. Loke
*Assistant Examiner*—Douglas W. Owens
(74) *Attorney, Agent, or Firm*—Jacqueline J. Garner; Wade James Brady, III; Frederick J. Telecky, Jr.

(57) ABSTRACT

A method of fabricating a semiconductor device and the device which includes initially providing a layer of silicon having a thin oxide layer thereon and a patterned layer of a masking material not permeable to at least selected oxygen-bearing species and having a sidewall disposed over said oxide layer to provide an exposed intersection of the masking material and the oxide layer. An oxygen-bearing species conductive path is then formed on the sidewall of the masking material extending to the exposed intersection for conducting the selected oxygen-bearing species. A sidewall layer of a material different from the conductive path is formed on the conductive path. An oxygen-bearing species is then applied to the exposed intersection through the path and a thick oxide surrounding the masking material is fabricated concurrently or as a separate step. The masking material is preferably silicon nitride, the path is preferably silicon oxide and the sidewall layer is preferably silicon nitride.

14 Claims, 1 Drawing Sheet

OXIDE PROFILE MODIFICATION BY REACTANT SHUNTING

This application is a division of 08/942,058, filed Oct. 1, 1997.

BACKGROUND OF THE INVENTION

Field of the Invention

A part of the fabrication process for semiconductor devices involves the formation of a field oxide to separate from each other the active regions in which the devices are to be fabricated. This part of the process generally involves the formation of a nitride layer mask over silicon with pad oxide thereon at what will later be the active region(s) with oxidation of the exposed (without nitride thereover) silicon to form the field oxide. A problem has been that some of the oxidizing species will migrate under the corner of the nitride layer and oxidize some of the silicon under the nitride layer, this phenomenon being known as "bird's beak" as well as by other names and generally not being controllable. In order to minimize the likelihood of such migration of an oxidizing species under the nitride layer to form additional silicon oxide with the underlying silicon, the prior art has removed a portion of the pad oxide at the corner formed by the silicon and nitride layer, regrown a thinner layer of oxide in the undercut region and then placed a sidewall nitride onto the nitride layer which also fills the remainder of the undercut region over the regrown oxide. The field oxide is then grown. There have been recent proposals with recessed isolation whereby the oxidant can be completely prevented from reaching the silicon surface under the nitride. For this case, it appears advantageous to provide for a small amount of oxidation at the corner to provide rounding for control of stress and field enhancement. Such "bird's beak" elimination is required as dimensions are scaled below 0.25 micron and become increasingly susceptible to stress and field emission leakages. In these approaches, it is difficult to balance the various steps to provide for optimum oxidation of the corner region while maintaining acceptable encroachment and an independently adjustable process is required to improve control of the process results.

SUMMARY OF THE INVENTION

In accordance with the present invention, a procedure is provided which enables greatly improved control of the oxidation profile at the corner of the nitride layer and the underlying silicon layer or "bird's beak" region.

Briefly, there is provided the nitride mask of the prior art which is not permeable to at least selected oxygen-bearing species. A path is then provided as a permanent part of the device being fabricated, which is used during device fabrication, which extends under the nitride mask and which is capable of directing the selected oxygen bearing-species or reactants to specific locations under the nitride mask. This permits an increase in oxide thickness during general growth of the thick oxide at preferred locations which are otherwise either not accessible or accessible without adequate oxide growth control. This path is preferably an oxide layer which is as thin as possible but still capable of performing its function. This path is provided as a sidewall to the nitride mask and extends to the corner formed by the nitride mask and the silicon layer thereunder with pad oxide. The thickness of this path, preferably a thin oxide layer, is critical only to the extent that it be capable of directing the oxygen bearing species therethrough in sufficient amount to provide the desired amount of oxide formation in the time available. The above described path is formed as a sidewall on the nitride mask and prior to formation of the subsequent sidewall nitride which is now provided as a sidewall on the path for oxygen-bearing species as described above.

DESCRIPTION OF THE PREFERRED EMBODIMENT

Figure 1A:
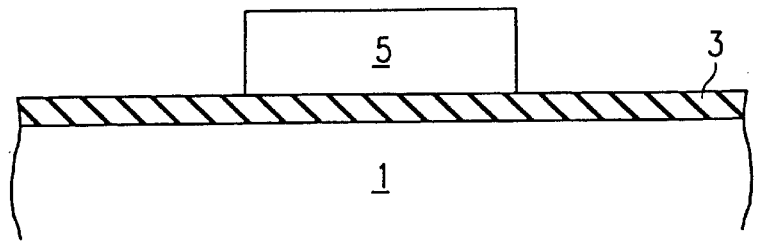
FIGS. 1a to 1d are a diagram of the portion of a semiconductor fabrication process flow in accordance with the present invention, the remainder of the process flow being standard.
Figure 1B:
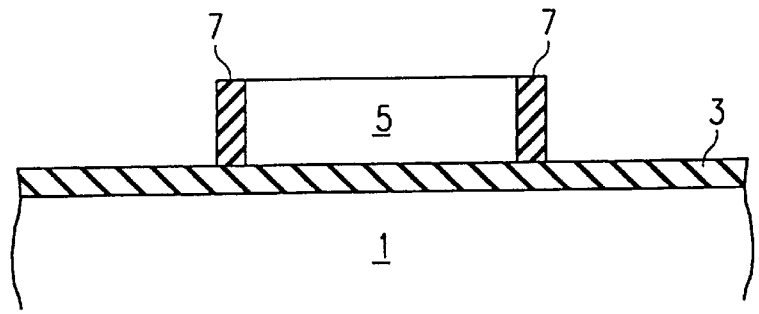
Figure 1C:
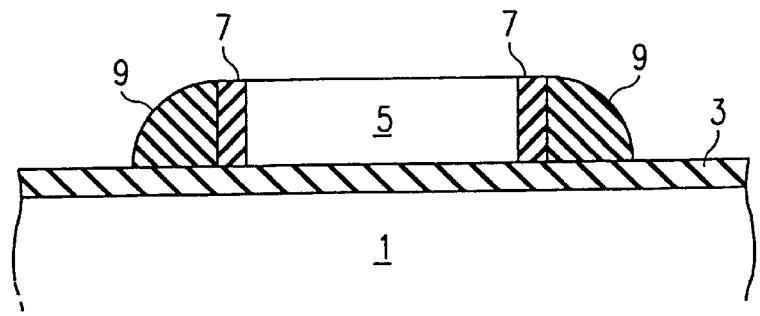
Figure 1D:
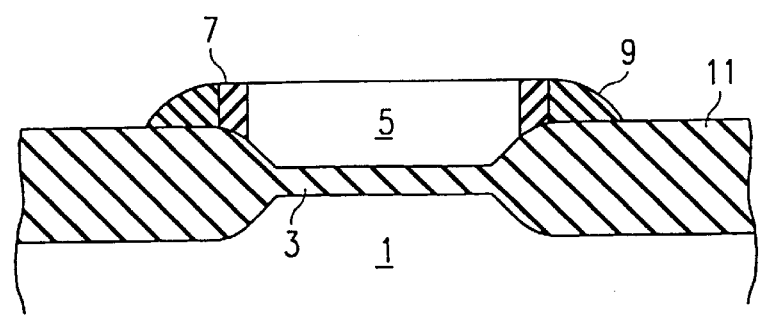

Referring first to FIG. 1a, there is shown a layer of silicon semiconductor material 1 having a pad oxide 3 thereon and a silicon nitride mask 5 over a portion of the exposed surface of the pad oxide which has been patterned in standard manner. A sidewall silicon oxide 7 is then formed on the sidewalls of the nitride mask 5 in standard manner, the sidewall silicon oxide extending to the pad oxide 3 at the intersection of the mask with the pad oxide with silicon 1 below the pad oxide as shown in FIG. 1b. This pad oxide 3 is permeable to oxygen-bearing species, preferably oxygen or steam. A sidewall silicon nitride layer 9 is then formed in standard manner over the portion of the pad oxide 3 adjacent the sidewall oxide 7, the sidewall silicon nitride layer extending along the sidewall oxide as shown in FIG. 1c. The thick field oxide 11 is then grown in standard manner, such as by applying steam to the exposed surface of the partially fabricated device of FIG. 1c, as shown in FIG. 1d. While the thick field oxide 11 is being formed, the oxygen-bearing species travels through the sidewall oxide 7 which acts as a path for the oxygen-bearing species and to the intersection of the mask 5 with pad oxide 3 and silicon layer 1 to provide controlled oxide growth at the corner. This control is determined in part by the density of the path 7, the specific material, its dimensions and the ability of the particular oxygen-bearing species to traverse the path through sidewall oxide 7.

It can be seen that there has been provided a process for controlling the profile of the field oxide of a semiconductor device during the fabrication process and particularly at the bird's beak region.

Though the invention has been described with reference to a specific preferred embodiment thereof, many variations and mondifications will immediately become apparent to those skilled in the art. It is therefore the intention that the appended claims be interpreted as broadly as possible in view of the prior art to include all such variations and modifications.

What is claimed is:

1. A semiconductor device which comprises:
   (a) a layer of silicon having a thin oxide layer thereon;
   (b) a patterned layer of a masking material non-premeable to at least selected oxygen-bearing species and having a sidewall disposed over said oxide layer to provide an intersection of said masking material and said thin oxide layer;
   (c) a conductive path for said selected oxygen-bearing species on the sidewall of said masking material extending to said intersection capable of conducting said selected oxygen-bearing species to said intersection;

(d) a sidewall layer of a material different from said conductive path on said conductive path; and (e) a region of oxide thicker than said thin oxide layer disposed under said conductive path and said sidewall layer.

2. The device of claim 1 wherein said masking material is silicon nitride.

3. The device of claim 1 wherein said path is silicon oxide.

4. The device of claim 2 wherein said path is silicon oxide.

5. The device of claim 1 wherein said sidewall layer is silicon nitride.

6. The device of claim 2 wherein said sidewall layer is silicon nitride.

7. The device of claim 3 wherein said sidewall layer is silicon nitride.

8. The device of claim 1 wherein said sidewall layer is non-permeable to said selected oxygen-bearing species.

9. The device of claim 8 wherein said masking material is silicon nitride, said path is silicon oxide and said sidewall layer is silicon nitride.

10. The device of claim 1 wherein said region of oxide thicker than said oxide layer is coupled to and is an extension of said thin oxide layer.

11. The device of claim 8 wherein said region of oxide thicker than said oxide layer is coupled to and is an extension of said thin oxide layer.

12. The device of claim 9 wherein said region of oxide thicker than said oxide layer is coupled to and is an extension of said thin oxide layer.

13. The device of claim 10 wherein said masking material is silicon nitride, said path is silicon oxide and said sidewall layer is silicon nitride.

14. The device of claim 13 wherein said sidewall layer is non-permeable to said selected oxygen-bearing species.

* * * * *